April 1, 1969 D. S. JARRAD 3,436,616

OHMIC CONTACT CONSISTING OF A BILAYER OF GOLD AND MOLYBDENUM OVER AN ALLOYED REGION OF ALUMINUM-SILICON

Filed Feb. 7, 1967

INVENTOR.
Donald S. Jarrad

BY

Mueller, Aichele & Rauner

ATTYS.

United States Patent Office 3,436,616

Patented Apr. 1, 1969

3,436,616
OHMIC CONTACT CONSISTING OF A BILAYER OF GOLD AND MOLYBDENUM OVER AN ALLOYED REGION OF ALUMINUM-SILICON

Donald S. Jarrad, Tempe, Ariz., assignor to Motorola, Inc., Franklin Park, Ill., a corporation of Illinois Filed Feb. 7, 1967, Ser. No. 614,472
Int. Cl. H01l 3/08
U.S. Cl. 317—234 5 Claims

ABSTRACT OF THE DISCLOSURE

An ohmic contact for a semiconductor structure including an alloy of aluminum and the semiconductor material, with successive layers of molybdenum and gold in substantially ohmic contact therewith. The molybdenum layer has a sufficient thickness to segregate the alloy portion from the gold.

*Background*

This invention relates to semiconductor devices and more particularly to an improved ohmic contact for a semiconductor structure.

An ohmic contact is a connection whose electrical resistance does not vary to any significant extent with variations in polarity and voltage drop. The formation of a stable ohmic contact, i.e., one whose characteristics do not change with time, is important in the fabrication of semiconductor devices. The advantages of low operating power requirements and high speed for certain semiconductor devices are defeated if a suitable ohmic contact cannot be formed.

With the advance of technology in the semiconductor field, the size of semiconductor structures has generally decreased. A contributing factor to this decrease in size has been the use of epitaxial growth and selective diffusion techniques. With this decrease in size, an individual circuit component of a semiconductor device, such as a transistor, becomes so minute that direct connections to an external circuit are difficult.

Minute semiconductor structures of this nature have been connected to external circuitry by a layer of metallization that extends through openings in an insulating layer to make contact with an underlying region of the structure. This metallization is utilized to enlarge available contact area and provide a material suitable for physical connection with an external circuit. Generally a fine wire is bonded to the metallization on the surface of the structure and, in turn, bonded to an external lead for the device. Aluminum and gold wires are widely used for connections between the metallization and the external leads, with gold being preferred because of its lower electrical resistance and higher bond strength.

Many metals have been used for forming ohmic contacts with a semiconductor structure. Aluminum is generally preferred because it is suitably adherent to both silicon dioxide and silicon, is easily deposited, and when properly used, has substantially no effect upon device characteristics.

Aluminum is an acceptor impurity. Therefore, when connections are made to n-type regions with aluminum, a highly doped (n+) contact region is provided to prevent the occurrence of a rectifying junction. When aluminum is utilized for the metallization, it is generally necessary to use aluminum wires for connections to external leads.

When gold wires were bonded directly to aluminum, the resulting contact was unstable because of what is believed to be the formation of an intermetallic compound of the gold and aluminum. This compound is often referred to as "purple plague" because of the appearance of a purple colored region when the aluminum and gold are brought into contact, particularly in the presence of silicon. When this difficulty arises, a high resistance electrical contact is formed, defeating the purpose of the ohmic contact.

To avoid the interaction of gold with aluminum multiple metal systems have been tried in which the gold and aluminum have been separated by a third metal. One such system comprises layers of aluminum, chromium and gold in which the chromium is deposited over the entire surface of the aluminum to separate the gold therefrom. Devices with this metal system developed purple plague after storage at 475° C. for about two hours. Thicknesses of chromium up to one micron were utilized, but they still did not provide adequate protection. Spikes of aluminum were found to penetrate the chromium layer and contact the gold. Even when a limited amount of aluminum was used for the contact to the semiconductor structures, spikes occurred that resulted in deterioration of the contact.

*The invention*

Accordingly, it is an object of this invention to provide an improved electrical contact to a semiconductor structure.

Another object of the invention is to provide an electrical contact to a semiconductor structure such that a gold wire may be used for connecting the semiconductor structure to an external lead for the semiconductor device.

A further object of the invention is to provide an electrical contact to a semiconductor structure that combines the advantages of aluminum and gold, and is substantially free of the detrimental behavior that has been observed when these metals are used in the presence of silicon.

One feature of the invention is the use of an aluminum-silicon alloy contact region confined to a pre-selected area of the semiconductor structure.

An additional feature of the invention is the provision of a layer of molybdenum that completely covers the exposed surfaces of the aluminum-silicon alloy region.

A further feature of the invention is a layer of gold electrically integrated with the molybdenum, to which the lead wires may be connected.

The invention is embodied in a semiconductor structure having an ohmic contact comprising an alloy of aluminum with the semiconductor material. A layer of molybdenum covers the aluminum alloy, and a layer of gold covers the molybdenum, the successive layers forming ohmic contacts with one another and with the semiconductor. The layer of gold is thereby segregated from the aluminum alloy by the film of molybdenum.

*Drawings*

An embodiment of the invention is presented in the accompanying drawings, in which.

Figure 1:
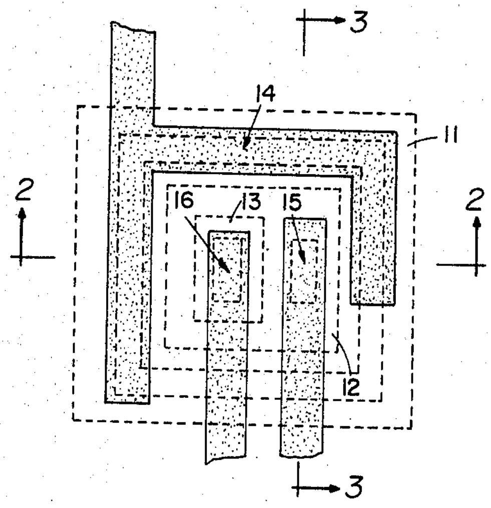
FIG. 1 is an enlarged plan view of a semiconductor structure having an ohmic contact embodying the invention.

In FIG. 1, a transistor having an ohmic contact illustrative of the invention is shown, including a collector region 11, a base region 12 and an emitter region 13. The invention is not limited to transistors and may be used with other semiconductor structures such as diodes, resistors, integrated circuits, etc. formed in a body of semiconductor material. Electrical contacts 14, 15 and 16 are made, respectively, to collector region 11, base region 12 and emitter region 13.

Figure 2:
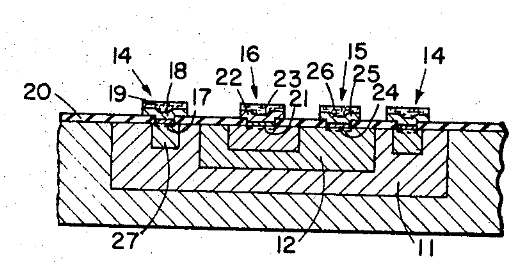
FIG. 2 is an enlarged cross-sectional view of the semiconductor structure of FIG. 1 along a line 2—2.

As seen in FIG. 2, contact 14 comprises an alloy region 17 of aluminum and the semiconductor material, a film of molybdenum 18 in ohmic contact with region 17 and a layer of gold 19 in ohmic contact with molybdenum film 18. Alloy region 17 is confined to an opening in mask 20 of silicon dioxide. Film 18 completely covers the exposed surface of region 17 and extends over part of the exposed surface of mask 20. Similarly, contact 16 includes an alloy region 21 of aluminum and the semiconductor material, a film 22 of molybdenum and a layer 23 of gold. Contact 15 comprises an alloy portion 24, a film of molybdenum 25 and a layer of gold 26.

The transistor has a collector region 11 of n-type semiconductor material, a base region 12 of p-type semiconductor material, and an emitter region 13 of n-type semiconductor material. This structure is generally referred to as an NPN transistor; the invention can also be used on PNP transistors. Aluminum is a p-type impurity and therefore may be alloyed directly with base region 12 to form alloy region 24. However, to form a contact to collector 11, which is of high resistivity material, a low resistivity n+ region 27 was provided in which alloy region 17 was formed. Emitter 13 is a low resistivity n+ region and therefore forms a non-rectifying junction with alloy region 21.

Such a transistor is typically about six mils by six mils square with regions 11, 12 and 13 having combined surface areas between about 30 and 40 square mils. Therefore, the molybdenum and gold layers are extended over the silicon dioxide mask to form large bonding pads to which fine wires may be connected for joining the transistor to external leads.

Figure 3:
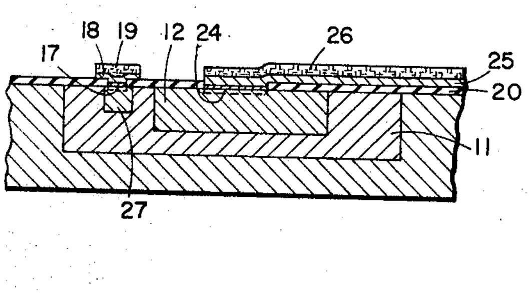
FIG. 3 is a cross-sectional view of the semiconductor structure of FIG. 1 along a line 3—3.

An extension of contact 15 is illustrated in FIG. 3. Molybdenum layer 25 extends from alloy region 24 across silicon dioxide mask 20 and forms a first layer for the bonding pad. Layer 26 of gold on molybdenum layer 25 extends therewith to form the top layer of the bonding pad.

The semiconductor devices of the present invention are generally fabricated from single crystal elements of silicon or germanium. The active devices are formed by successive photoresist steps in which openings are cut in the silicon oxide. After each photoresist step, a diffusion of some type impurity is carried out, and at the same time additional oxide is formed. After the complete circuit has been formed by diffusion, an opening is cut into the silicon dioxide for each junction to which contact is to be made. The wafer is then metallized with aluminum, preferably by vacuum evaporation.

The thickness of the aluminum is advantageously between about 400 and 1500 angstroms and preferably between about 800 and 1000 angstroms. Portions of the aluminum layer are removed so that the only aluminum remaining is in contact with the semiconductor body exposed through openings in the oxide layer, known as the preohmic holes. This aluminum may be readily patterned using known photoresist techniques and etchants for aluminum.

The aluminum remaining on the surface is alloyed with the semiconductor body forming a shallow alloyed portion which may extend from 0.05 micron to about 0.5 micron into the body of semiconductor material, and preferably extending between about 0.1 micron and 0.3 micron into the body of the semiconductor material. The thickness of the aluminum is preferably selected so that the area will be highly doped yet leave only a small amount of aluminum to remove after alloying.

A shallow alloy region may be formed by placing the semiconductor wafers, with the patterned aluminum thereon, on a graphite strip heater and heating the same to a suitable alloying temperature, slightly in excess of the eutectic temperature (577° C.). For example, wafers placed on a strip heater that was subsequently heated to a temperature between about 580° and 610° C., were observed to form a suitable alloy within a few seconds. The formation of this alloy may be controlled by visual observation of the wafers.

At the termination of the alloying a small quantity of pure aluminum may remain on the surface. If it were allowed to remain, aluminum spikes could form during later heat treatment. The free aluminum is preferably removed by treating the wafer with an etchant for aluminum. Many suitable etchants are known for aluminum, such as dilute aqueous solutions of nitric acid, acetic acid, or phosphoric acid. After completion of the alloying cycle and removal of remaining free aluminum, the surface of the wafer is cleaned to insure that no contaminants have been left thereon.

A thin film of molybdenum is then deposited on the entire surface of the wafer using known methods. The thickness of the molybdenum should be sufficient to act as a barrier between the alloyed aluminum and the gold layer to be deposited thereon. The molybdenum film advantageously has a thickness between about 2000 and 5000 angstroms and preferably between about 3000 and 4000 angstroms. This film is advantageously formed on the aluminum using a sputtering technique, preferably a low energy, subatmospheric pressure, triode sputtering system in which the wafers are placed in a suitable chamber such as a bell jar, filled with an inert gas at subatmospheric pressure. The sputtering should be performed so that molybdenum atoms impinge upon the surface of the structure and adhere thereto.

After the molybdenum has been deposited a layer of gold is deposited thereon. Advantageously, the initial portion of the gold layer is deposited by sputtering a mixture of molybdenum and gold, using methods known in the art. The initial gold layer has a thickness between about 500 and 2000 angstroms and preferably between about 1000 and 1500 angstroms. Additional gold is usually provided by evaporating the gold in a separate vacuum system, while it is in a heated condition. The total thickness of the gold layer is preferably between 7000 and 8000 angstroms.

The molybdenum and gold layers are then patterned to form electrical connections joining selected regions with each other or bonding pads. The pattern may be produced by utilizing known photoresist techniques and removing the metals with suitable etchants. For example, the gold may be etched with a cyanide solution and the molybdenum with a dilute nitric acid solution.

The remaining regions of the semiconductor device may have a square, rectangular, stripe, circular or other geometrical pattern. The device itself may be a diode, transistor, resistor or other semiconductor structure, or it may be an integrated circuit including many components.

Semiconductor structures having ohmic contacts with a configuration according to the invention exhibited improved electrical characteristics over previous configurations when connected to external leads with gold wires.

The above description and drawings show that the present invention provides a novel and improved ohmic contact for a semiconductor structure. Furthermore, a semiconductor structure having this contact may be connected to an external lead with a gold wire. The invention provides a contact combining the advantages of aluminum and gold that is substantially free of the detrimental aspects normally occurring when these metals are used in the presence of silicon.

I claim:

1. A semiconductor structure comprising a semiconductor element, a passivative layer thereon having openings therein for establishing ohmic contact with portions of the semiconductor, aluminum alloyed with the semiconductor and substantially confined to said openings, molybdenum covering the aluminum alloy, and gold covering the molybdenum.

2. A structure as defined by claim 1 wherein said semiconductor is silicon, and said passivation layer comprises $SiO_2$.

3. A structure as defined by claim 1 wherein said molybdenum comprises a film covering said passivation layer and said aluminum.

4. A structure as defined by claim 3 wherein said gold comprises a film covering said molybdenum.

5. A structure as defined by claim 4 wherein said molybdenum film has a thickness of at least 2000 angstroms, sufficient to form an effective barrier between the gold and aluminum.

References Cited

UNITED STATES PATENTS 3,290,570 12/1966 Cunningham -------- 417—240

JOHN W. HUCKERT, *Primary Examiner*.

M. EDLOW, *Assistant Examiner*.

U.S. Cl. X.R.

307—235